United States Patent [19]

Iida et al.

[11] 4,103,258
[45] Jul. 25, 1978

[54] PULSE GENERATOR INCLUDING A CAPACITOR WHICH IS DISCHARGED THROUGH A THYRISTOR

[75] Inventors: Takahiko Iida; Yasunobu Arita, both of Itami, Japan

[73] Assignee: Mitsubishi Denki Kabushiki Kaisha, Tokyo, Japan

[21] Appl. No.: 778,217

[22] Filed: Mar. 16, 1977

[30] Foreign Application Priority Data

| Mar. 18, 1976 | [JP] | Japan | 51-32788[U] |
| Mar. 25, 1976 | [JP] | Japan | 51-36223[U] |
| Mar. 25, 1976 | [JP] | Japan | 51-36224[U] |
| Jun. 22, 1976 | [JP] | Japan | 51-82580[U] |
| Jul. 9, 1976 | [JP] | Japan | 51-91968[U] |
| Aug. 5, 1976 | [JP] | Japan | 51-105335[U] |

[51] Int. Cl.$^2$ ............................................. H03K 3/35
[52] U.S. Cl. ............................... 331/111; 315/241 P; 331/107 R; 331/143
[58] Field of Search ................... 331/107 R, 111, 143; 315/209 SC, 239, 241 P, 241 S, 245

[56] References Cited

U.S. PATENT DOCUMENTS 3,302,128  1/1967  Schoemehl et al. ............. 331/111 X
3,868,683  2/1975  Darrow ........................... 331/111 X
3,887,884  6/1975  Suzuki ........................... 331/111

FOREIGN PATENT DOCUMENTS 9,485  5/1969  Japan ........................... 331/111

Primary Examiner—Siegfried H. Grimm
Attorney, Agent, or Firm—Oblon, Fisher, Spivak, McClelland & Maier

[57] ABSTRACT

A pulse generating circuit is provided by charging from a DC power source through charging resistor to a capacitor; detecting the preset value of the charging condition of the capacitor; discharging the charge of the capacitor through a main thyristor by triggering the main thyristor and generating a pulse output to a load by the discharging current. The pulse generating circuit comprises a shunt circuit for dividing the voltage of the DC power source beside the circuit for charging the capacitor whereby the potential of the shunt point is compared with the charged voltage of the capacitor through a three terminal trigger element and the trigger element is turned on when the charged voltage of the capacitor becomes substantially equal to the voltage of the DC power source to obtain the trigger output of the main thyristor.

11 Claims, 14 Drawing Figures

PULSE GENERATOR INCLUDING A CAPACITOR WHICH IS DISCHARGED THROUGH A THYRISTOR

BACKGROUND OF THE INVENTION

1. Field of the Invention

The present invention relates to an improvement of a pulse generating circuit for generating a steep pulse output by rapidly discharging a charge of a capacitor.

2. Description of the Prior Art

Simple pulse generating circuits for generating a steep pulse output by discharging the charge of a capacitor to feed the discharged current, have been used for generating a spark for a flash for photography or for firing of a gas lighter or a stove.

FIG. 1 is a circuit diagram of one embodiment of the conventional pulse generating circuit wherein the reference numeral 1 designates a DC power source such as a dry battery having 9 to 12V; 2 designates a starting switch; 3 designates a charging resistor; 4 designates a capacitor; 5 designates a trigger element; 6 designates a thyristor; 7 designates a load (load resistor); and 8 and 9 respectively designate output terminals.

The operation of the circuit will now be briefly described.

When the starting switch 2 is turned on, the capacitor 4 is charged from the DC power source 1 through the switch 2 and the charging resistor 3. The charging time constant is given depending upon the resistance of the charging resistors 3 and the capacitance of the capacity 4. When the charged voltage of the capacitor 4 reaches the switching voltage ($E_s$) of the trigger element 5, the trigger element 5 is turned on to feed the trigger signal to the gate of the thyristor 6 to turn on the thyristor 6. As a result, the charge of the capacitor 4 is discharged through the load resistor 7 and the thyristor 6 to generate a pulse output between the output terminals 8, 9 of both ends of the load resistor 7.

FIG. 2 shows the voltage waveform of the capacitor 4 in such an operation mode. The charging operation is initiated by turning on the starting switch 2. When the charged voltage reaches the switching voltage ($E_s$) of the trigger element 5 at the time $t_1$, the charge is immediately discharged to zero. After the discharge, the thyristor 6 is immediately turned off and the charging operation to the capacitor 4 is initiated. The operation is repeated.

Accordingly, as shown in FIG. 2, the charging and discharging operation is repeated in the period $t_1$ given by the specific switching voltage ($E_s$) during the time in the ON state of the starting switch 2 to obtain the continuous pulse output between the output terminals 8, 9.

However, in such a circuit, the initiation of the discharge is decided depending upon the specific switching voltage ($E_s$) given by the trigger element 5.

If the voltage of the DC power source 1 is lowered to be incapable of charging to the switching voltage ($E_s$), it is impossible to obtain the pulse output because of no discharge. This is a fatal disadvantage.

Accordingly, when the voltage of the DC power source 1 is significantly changed, the switching voltage ($E_s$) of the trigger element 5 must be set at a relatively low level under the consideration of the change of the voltage of the DC power source. Accordingly, the voltage of the pulse output is lowered whereby the output voltage being proportional to the voltage of the DC power source 1 can not be obtained. When the voltage of the DC power source 1 is decreased to lower than the switching voltage ($E_s$), the output is not generated. In this case, it is difficult to distinguish this fact from the failure of the circuit to stop the generation of the output.

SUMMARY OF THE INVENTION

It is an object of the present invention to provide an improved pulse generating circuit.

Another object of the present invention is to provide a pulse generating circuit for precisely obtaining an output proportional to the voltage of the DC power source even though the voltage of the power source is varied.

Another object of the present invention is to provide a pulse generating circuit which generates an output pulse by detecting the time when the capacitor is charged to be substantially equal to the voltage of the DC power source.

Another object of the invention is to provide a pulse generating circuit which maintains a longer life of the dry battery by preventing needless consumption of energy of the dry battery of the DC power source.

A further object of the present invention is to provide a pulse generating circuit for generating a pulse output at the same time the starting switch is turned on.

The foregoing and other objects of the present invention have been attained by providing a pulse generating circuit which comprises a shunt circuit for dividing the voltage of the DC power source beside a circuit for charging the capacitor whereby the potential at the shunt point is compared with the charged voltage of the capacitor through a three terminal trigger element and the trigger element is turned on when the charged voltage of the capacitor becomes a substantially equal to the voltage of the DC power source to obtain the trigger output of the main thyristor which is a charged voltage detecting type circuit.

DETAILED DESCRIPTION OF PREFERRED EMBODIMENTS

Figure 1:
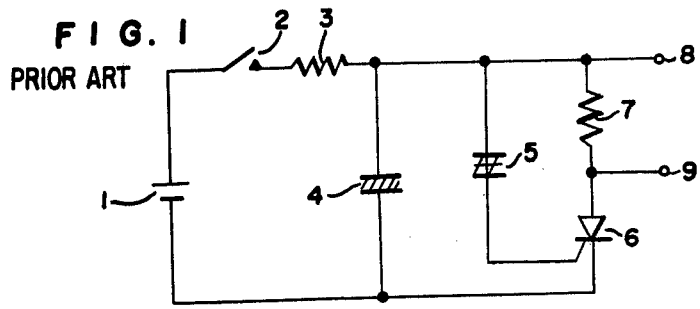
FIG. 1 is a circuit diagram of one embodiment of the conventional pulse generating circuit.
Figure 2:
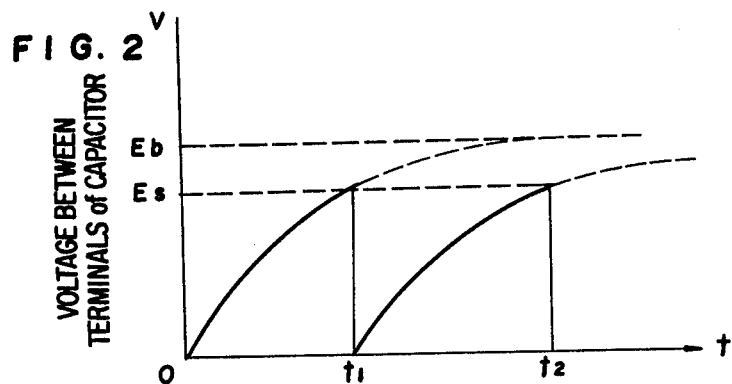
FIG. 2 shows the waveform of voltage of the capacitor in the operation mode of the circuit of FIG. 1.
Figure 3:
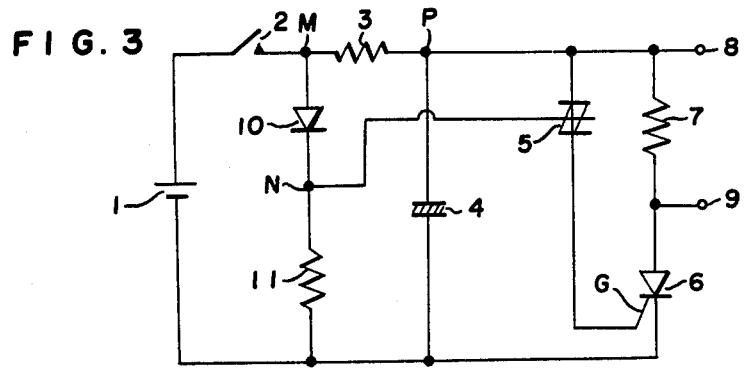
FIGS. 3 to 14 are respectively circuit diagrams of various embodiments of the pulse generating circuits according to the present invention.

FIG. 3 is a circuit diagram of one embodiment of the pulse generating circuit of the present invention wherein the DC power source 1 is connected in series to the starting switch 2, the charging resistor 3 and the capacitor 4 to form the charging circuit. On the other hand, a series connection of the main thyristor 6 and the load resistance 7 is connected between both ends of the capacitor 4 and the output terminals 8, 9 are lead out from both ends of the load resistor 7.

Between the gate terminal G of the main thyristor 6 and the positive pole terminal P of the capacitor 4 is connected a three terminal trigger element 5 whose cathode is connected to the gate terminal G and whose anode is connected to the positive pole terminal P.

Between the contact point M of the starting switch 2 and the charging resistor 3 and the negative terminal of the DC power source 1 is connected a shunt circuit of a series connection of a diode 10 and a resistor 11. The gate terminal of the trigger element 5 is connected to the middle contact point N of the shunt circuit.

The operation of the circuit will now be described.

When the starting switch 2 is turned on, the capacitor 4 is charged from the DC power source 1 through the starting switch 2, the charging resistor 3 and the capacitor 4. On the other hand, the gate potential of the trigger element 5 is always maintained at the value of difference between the voltage of the DC power source 1 and the barrier voltage of the diode 10 (about 0.5 to .07V). The operation of the circuit has different modes when the voltage of the DC power source 1 is higher or lower than the switching voltage ($E_s$) of the trigger element 5.

The operation in the case of the voltage of the DC power source 1 being higher than the switching voltage ($E_s$) of the trigger element 5 will now be described.

At the initiation of the charging operation, the voltage at the anode terminal of the trigger element 5 connected to the positive terminal of the capacitor 4 is lower than the gate potential whereby the current is not fed to the gate of the trigger element 5 and the trigger element 5 is not turned on.

However, when the capacitor 4 is charged to reach the switching voltage ($E_s$) of the trigger element 5, the trigger element 5 is turned on whereby the gate trigger current of the thyristor 6 is fed through the trigger element 5 to trigger the thyristor 6 and the charge of the capacitor 4 is discharged through the load resistor 7 to generate an output voltage between the output terminals 8, 9.

The operation in the case of the voltage of the DC power source 1 being lower than the switching voltage ($E_s$) of the trigger element 5 will now be described.

The trigger element 5 is not self-triggered. Thus, when the capacitor 4 is charged to the voltage of the DC power source 1, the current is fed from the anode terminal of the trigger element 5 to the gate terminal to turn on the trigger element 5 because the gate potential of the trigger element 5 is lower than the potential at the anode terminal for the barrier voltage of the diode 10.

As a result, the thyristor 6 is triggered to generate an output voltage between the output terminals 8, 9.

The gate current is fed to the trigger element 5 and the thyristor 6 is triggered to generate a pulse output between both ends of the load resistor 7 when the voltage of the DC power source 1 is higher than the switching voltage of the trigger element 5. It is also attained by detecting the charged voltage of the capacitor reaching the voltage of the DC power source when the voltage of the DC power source 1 is lower than the switching voltage of the trigger element 5.

Figure 4:
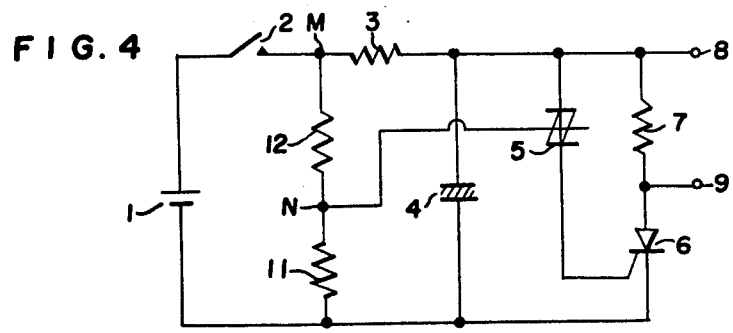

FIG. 4 shows another embodiment of the present invention wherein the diode 10 is replaced by a resistor 12 in the embodiment of FIG. 3. The same operation can be attained by selecting a suitable resistance for the resistor 12.

In the embodiments of FIGS. 3 and 4, a silicon unilateral switch (SUS) or a silicon bilateral switch (SBS) can be used as the trigger element 5.

Figure 5:
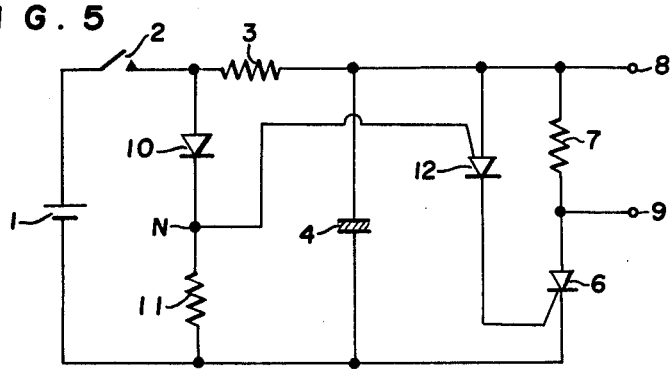

FIG. 5 shows another embodiment of the present invention wherein the trigger element 5 is replaced by a N gate thyristor 12 in the embodiment of FIG. 3. The gate of the N gate thyristor 12 is connected to the shunt point (N) of the shunt circuit. The operation of the circuit of FIG. 5 will now be described.

When the switch 2 is turned on, the capacitor 4 is charged from the DC power source 1 through the starting switch 2 and the charging resistor 3. The gate potential of the N gate thyristor 12 is maintained at a voltage realized by subtracting the barrier voltage of the diode (about 0.5 to 0.7 V) from the voltage of the DC power source 1. At the initiation of the charging operation, the voltage at the anode terminal connected to the positive terminal of the capacitor 4 is lower than the gate potential whereby the current is not fed to the gate of the N gate thyristor 12 and the N gate thyristor 12 is not turned on. Thus, when the voltage at the anode terminal of the N gate thyristor 12 is to substantially equal to the voltage of the DC power source by charging the capacitor 4, the gate current is fed from the anode of the N gate thyristor 12 to the gate to turn on the N gate thyristor 12. As a result, the gate trigger current is fed to the gate of the thyristor 6 to trigger the thyristor 6 whereby the charge of the capacitor 4 is discharged through the load resistor 7 to generate a voltage substantially equal to the voltage of the DC power source 1 between the output terminals 8, 9.

That is, the thyristor 6 is turned on to generate a pulse output between both ends of the load resistor 7 when the charged voltage of the capacitor 4 is substantially equal to the voltage of the DC power source 1.

Incidentally, two or more diodes 10 can be connected in series under the consideration of variation of the diode 10 caused by temperature.

Figure 6:
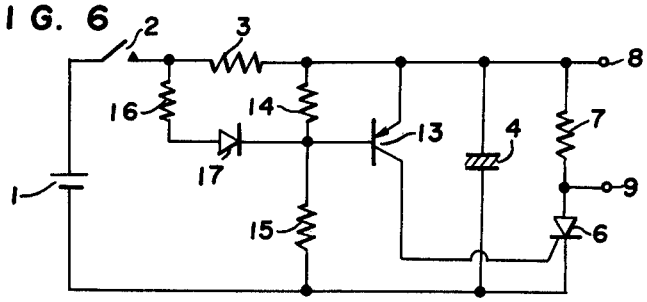

FIG. 6 shows another embodiment of the pulse generating circuit of the present invention wherein the reference numeral 13 designates a PNP transistor and 14 to 16 designate resistors 17 designates a diode.

The collector of the transistor 13 is connected to the control terminal of the thyristor 6, the emitter of the transistor 13 is connected between the resistor 3 and the capacitor 4, the cathode of the rectifier 17 is connected to the base of the transistor 13 and the anode of the rectifier 17 is connected through the resistor 16 to the positive terminal of the DC power source 1 the resistor 14 is connected between the emitter-base of the transistor 13 and the resistor 15 is connected between the base of the transistor 13 and the negative terminal of the DC power source 1.

The operation of the pulse generating circuit will now be described.

When the voltage of the DC power source 1 is significantly higher than the charged voltage of the capacitor 4, the capacitor 4 is charged through the resistor 3 and also through the resistor 16, the diode 17 and the resistor 14. As a result, a voltage drop is caused in the resistor 14. The polarity of the voltage drop is in the direction for the reverse-bias of the emitter-base of the transistor 13 whereby the transistor 13 is turned off and the current is not fed to the gate of the thyristor 6.

On the other hand, when the charged voltage of the capacitor 4 becomes substantially equal to the voltage of the DC power source 1, the current fed to the diode 17 becomes zero whereby the charge of the capacitor 4 is discharged through the resistor 14 and the resistor 15. The polarity of the voltage drop in the resistor 14 is opposite to that in the charging operation to turn on the transistor 13. Accordingly, the collector current of the transistor 13 turns on the thyristor 6. At this time, the charged voltage of the capacitor 4 is the value realized by subtracting the voltage drop of the rectifier 17 (about 0.7 V) from the voltage of the DC power source 1 whereby a large output voltage is applied to the load resistor 7 and it is not fixed to the switching voltage ($E_s$) of the transistor 13.

In a circuit for firing a gas lighter, it is preferable to give a higher spark voltage for firing it without failure.

Figure 7:
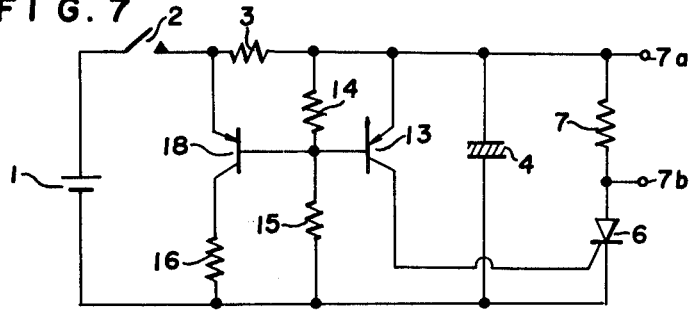
Figure 8:
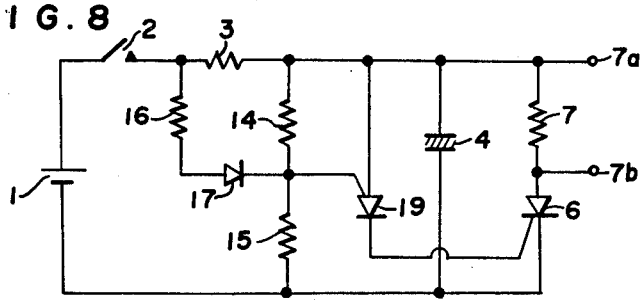

FIGS. 7 and 8 respectively show modifications of the pulse generating circuit of FIG. 6.

In the embodiment of FIG. 7, the diode 17 and the resistor 16 of FIG. 6 are replaced by the series connection of a PNP transistor 18 and a resistor 16 which are connected to the DC power source 1. The base of the transistor 18 is connected to the base of the transistor 13.

In the embodiment of FIG. 8, the transistor 13 of FIG. 6 is replaced by a N gate thyristor 19.

It imparts the same function as that shown in FIG. 6.

Figure 9:
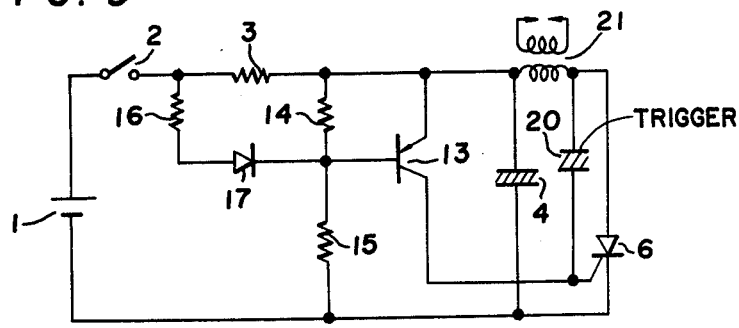
Figure 10:
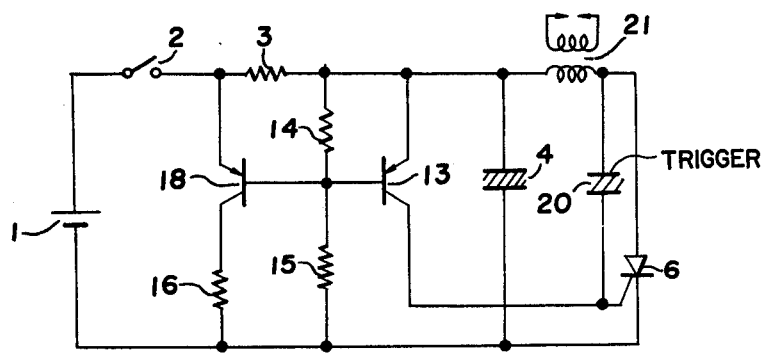

FIGS. 9 and 10 respectively show other embodiments improved from those of FIGS. 6 and 7. In FIGS. 9 and 10, a trigger element 20 such as an SUS or an SBS is connected between the anode-gate of the thyristor 6 and a firing transformer 21 is used instead of the load resistor 7.

In the circuits of FIGS. 6 and 7, when the charged voltage of the capacitor 4 reaches the voltage of the DC power source 1, the charge of the capacitor 4 is discharged. Accordingly, when the voltage of the DC power source 1 is high, that is when consumption of a dry battery is small, excess energy such as more than two times minimum energy needed for generating the pulse output is present disadvantageously causing a shorter life of the battery.

Moreover, the discharging is always carried out after charging the capacitor 4 to the voltage of the DC power source whereby the period for generating the pulse output is disadvantageously long.

Accordingly, in the circuits of FIGS. 9 and 10, the switching voltage of the trigger element 20 is preset at a desired value whereby the charge of the capacitor 4 is discharged when the charged voltage of the capacitor 4 reaches a predetermined minimum voltage (constant) needed for spark discharge, if the DC source voltage is higher than the switching voltage of the trigger element 20.

The operations of the circuits will now be described.

When the voltage of the battery 1 is higher than the switching voltage ($V_s$) of the trigger element 20, the capacitor 4 is charged to the switching voltage ($V_s$). At the time the charged voltage reaches this value, the trigger element 20 is turned on whereby the thyristor 6 is triggered. The charge of the capacitor 4 is discharged through the primary winding of the firing transformer 21 to cause the spark in a secondary winding side of the transformer 21.

On the other hand, when the voltage of the battery 1 is lower than the switching voltage ($V_s$) of the trigger element 20, the trigger element 20 is not turned on. Accordingly, the circuits are operated as in the embodiments of FIGS. 6 and 7. The spark is generated in the secondary winding side of the firing transformer 21 until the voltage of the battery decreases to the limit given by the discharge gap in the secondary winding side of the firing transformer 21.

In accordance with these circuits, a needless energy loss can be prevented to significantly prolong the life of the battery.

When the circuit is designed to trigger the trigger element 20 during most of the life of the battery, the charging resistor can be relatively high even though the discharge is repeated in a relatively short period. Accordingly, a thyristor 6 having a relatively small holding current can be used. Even though a battery 1 is employed so as to be lower than the switching voltage of the trigger element 20, the discharge is initiated after the charged voltage of the capacitor 4 is substantially equal to the voltage of the battery. Accordingly, the spark discharge can be attained at relatively low voltage of the battery even though the period for discharge is long. The life of the battery can be advantageously prolonged.

Figure 11:
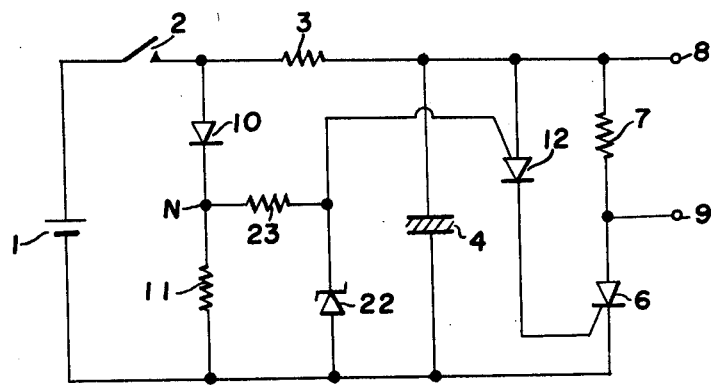
Figure 12:
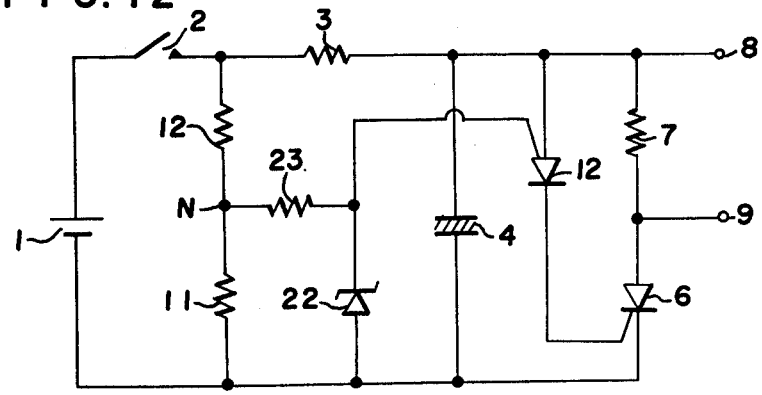

FIGS. 11 and 12 show other embodiments of the present invention for preventing consumption of needless energy of the DC power source.

The embodiment of FIG. 11 will now be described. In the embodiment of FIG. 11, a Zener diode 22 is connected between the gate terminal of the N gate thyristor 12 and the negative terminal of the capacitor 4 and a resistor 23 is connected between the gate of the N gate thyristor 12 and the shunt point (N) of the shunt circuit.

The operation of the circuit will now be briefly described.

The capacitor 4 is charged by turning on the starting switch 2. When the charged voltage becomes higher than the Zener voltage of the Zener diode 22, the closed circuit of capacitor 4 — anode of N gate thyristor 12 — gate of N gate thyristor 12 — Zener diode 22 — capacitor 4 is formed whereby the current is fed to the gate of the N gate thyristor 12 to turn on the thyristor 12 and the gate trigger current is fed to the thyristor 6 to turn on the thyristor 6.

In the operation described, the pulse output is generated to the output terminal.

On the other hand, when the voltage of the DC power source 1 is lower than the Zener voltage of the Zener diode 22, the charge of the capacitor 4 is discharged when the charged voltage of the capacitor 4 becomes substantially equal to the voltage of the DC power source 1.

In accordance with this circuit, the consumption of needless energy of the DC power source can be prevented without generating a needlessly large pulse output.

Figure 13:
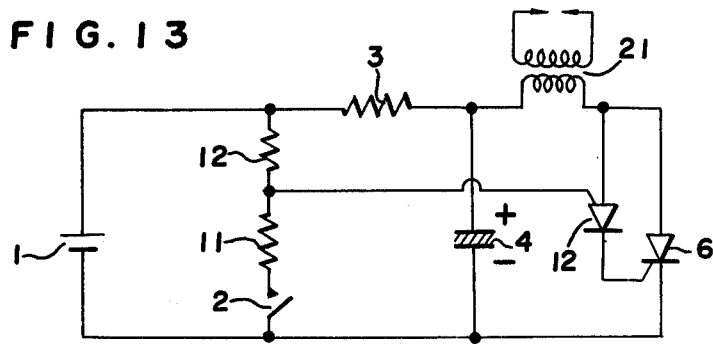
Figure 14:
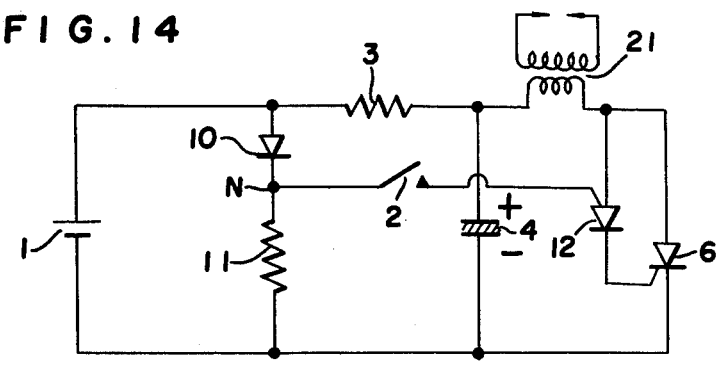

FIGS. 13 and 14 show other embodiments of the present invention to generate the pulse output at the same time the starting switch is turned on.

In the previous circuits, the capacitor 4 has substantially no charge by discharge before turning on the starting switch 2.

When the switch 2 is turned on, the charging operation is initiated and the spark discharge is generated when the charged voltage reaches the predetermined voltage. On the other hand, in the previous circuits, if the failure of firing of the gas lighter is caused at the first spark discharge, the switch 2 is kept in the ON state whereby the spark discharge is repeatedly generated in the time constant given by the capacitor 4 and the charging resistor 3. The repeating period is selected to be 0.5 to 1 second in order to prevent the consumption of the battery 1 by the repeating operation.

Accordingly, it takes 0.5 to 1 second for generating the first spark discharge after turning on the starting switch 2, whereby the loss of gas and the irritation of the user of the gas lighter are disadvantageously caused.

In accordance with the circuit of the embodiments of FIGS. 13 and 14, the position of the starting switch 2 is modified whereby the capacitor 4 is charged before turning on the starting switch 2 and the charge of the capacitor 4 is discharged at the same time the switch 2 is turned on.

In the embodiment of FIG. 13, the starting switch 2 is connected between the resistor 11 of the shunt circuit and the negative terminal of the DC power source 1.

In the embodiment of FIG. 14, the starting switch 2 is connected between the shunt point (N) of the shunt circuit and the gate terminal of the N gate thyristor 12.

The operation of the embodiment of FIG. 13 will now be described.

The capacitor 4 is charged to be substantially equal to the voltage of the DC power source 1 from the DC power source 1 through the charging resistor 3 before turning on the starting switch 2.

When the starting switch 2 is turned on, the capacitor 4 is discharged through the circuit of the positive terminal of capacitor 4 — firing transformer 21 — anode of N gate thyristor 12 — gate of N gate thyristor — resistor 11 — switch 2 — negative terminal of capacitor 4 whereby the N gate thyristor 12 is triggered to turn on the thyristor 6.

The operation of the embodiment of FIG. 14 is substantially the same as that of FIG. 13.

The starting switch 2 can be connected between the cathode of the N gate thyristor 12 and the gate of the thyristor 6.

In the embodiments of FIGS. 13 and 14, the charge of the capacitor 4 having the potential equal to the voltage of the DC power source 1 can be discharged at the same time the starting switch 2 is turned on whereby the pulse output for the firing transformer 21 can be generated without failure at the first moment and the effective range of the voltage of the DC power source 1 needed for generating the pulse output can be broadened and the consumption of the battery 1 can be minimized to prolong the life of the battery 1.

What is claimed is:

1. A pulse generating circuit which comprises:
   a DC power source having a positive terminal and a negative terminal;
   a capacitor having a positive terminal and a negative terminal connected in series through a resistor for charge to said DC power source;
   a series connection of a load and a main thyristor which is connected between both ends of said capacitor
   a shunt circuit for generating a predetermined shunt potential at a shunt point and said shunt circuit being connected between both ends of said DC power source;
   a three terminal trigger element whose main terminals are connected between the positive terminal of said capacitor and the gate terminal of said main thyristor and whose control terminal is connected to the shunt point of said shunt circuit;
   said shunt circuit comprising a series connection of a diode and a resistor;
   said three terminal trigger element comprising a silicon unilateral switch (SUS).

2. A pulse generating circuit which comprises:
   a DC power source having a positive terminal and a negative terminal;
   a capacitor having a positive terminal and a negative terminal connected in series through a resistor for charge to said DC power source;
   a series connection of a load and a main thyristor which is connected between both ends of said capacitor;
   a shunt circuit for generating a predetermined shunt potential at a shunt point and said shunt circuit being connected between both ends of said DC power source;
   a three terminal trigger element whose main terminals are connected between the positive terminal of said capacitor and the gate terminal of said main thyristor and whose control terminal is connected to the shunt point of said shunt circuit;
   said shunt circuit comprising a series connection of a diode and a resistor;
   said three terminal trigger element comprising an N gate thyristor.

3. A pulse generating circuit according to claim 2 wherein a Zener diode is connected between the gate terminal of said N gate thyristor and the negative terminal of said capacitor, and a resistor is connected between the gate terminal of said N gate thyristor and the shunt point of said shunt circuit.

4. A pulse generating circuit according to claim 2 wherein a starting switch is connected in a circuit which connects the anode-gate of said N gate thyristor and said shunt circuit.

5. A pulse generating circuit which comprises:
   a DC power source having a positive terminal and a negative terminal;
   a capacitor having a positive terminal and a negative terminal connected in series through a resistor for charge to said DC power source;
   a series connection of a load and a main thyristor which is connected between both ends of said capacitor;
   a shunt circuit for generating a predetermined shunt potential at a shunt point and said shunt circuit being connected between both ends of said DC power source;
   a three terminal trigger element whose main terminals are connected between the positive terminal of said capacitor and the gate terminal of said main thyristor and whose control terminal is connected to the shunt point of said shunt circuit;
   said shunt circuit comprises a series connection of two resistors;
   said three terminal trigger element comprises a silicon unilateral switch (SUS).

6. A pulse generating circuit which comprises:
   a DC power source having a positive terminal and a negative terminal;
   a capacitor having a positive terminal and a negative terminal connected in series through a resistor for charge to said DC power source;
   a series connection of a load and a main thyristor which is connected between both ends of said capacitor;
   a shunt circuit for generating a predetermined shunt potential at a shunt point and said shunt circuit being connected between both ends of said DC power source;
   a three terminal trigger element whose main terminals are connected between the positive terminal of said capacitor and the gate terminal of said main thyristor and whose control terminal is connected to the shunt point of said shunt circuit;
   said shunt circuit comprises a series connection of two resistors;
   said three terminal trigger element comprises an N gate thyristor.

7. A pulse generating circuit according to claim 6 wherein one end of said shunt circuit is connected to the junction between said resistor for charge and said capacitor and a series connection of a resistor and a diode is connected between the shunt point of said shunt circuit and the other side of said resistor for charge.

8. A pulse generating circuit according to claim 6 wherein a Zener diode is connected between the gate terminal of said N gate thyristor and the negative terminal of said capacitor and a resistor is connected between the gate terminal of said N gate thyristor and the shunt point of said shunt circuit.

9. A pulse generating circuit according to claim 6 wherein a starting switch is connected in a circuit which connects the anode gate of said N gate thyristor and said shunt circuit.

10. A pulse generating circuit which comprises:
- a DC power source having a positive terminal and a negative terminal;
- a capacitor having a positive terminal and a negative terminal connected in series through a resistor for charge to said DC power source;
- a series connection of a load and a main thyristor which is connected between both ends of said capacitor;
- a shunt circuit for generating a predetermined shunt potential at a shunt point and said shunt circuit being connected between both ends of said DC power source;
- a three terminal trigger element whose main terminals are connected between the positive terminal of said capacitor and the gate terminal of said main thyristor and whose control terminal is connected to the shunt point of said shunt circuit;
- said shunt circuit comprises a series connection of two resistors;
- said three terminal trigger element comprises a transistor;
- one end of said shunt circuit being connected to the junction between said resistor for charge and said capacitor and a series connection of a resistor and a diode being connected between the shunt point of said shunt circuit and the other side of said resistor for charge.

11. A pulse generating circuit which comprises:
- a DC power source having a positive terminal and a negative terminal;
- a capacitor having a positive terminal and a negative terminal connected in series through a resistor for charge to said DC power source;
- a series connection of a load and a main thyristor which is connected between both ends of said capacitor;
- a shunt circuit for generating a predetermined shunt potential at a shunt point and said shunt circuit being connected between both ends of said DC power source;
- a three terminal trigger element whose main terminals are connected between the positive terminal of said capacitor and the gate terminal of said main thyristor and whose control terminal is connected to the shunt point of said shunt circuit;
- said shunt circuit comprises a series connection of two resistors;
- said three terminal trigger element comprises a transistor;
- one end of said shunt circuit being connected to the junction between said resistor for charge and said capacitor and a base of a PNP transistor being connected to the shunt point of said shunt circuit;
- an emitter of said PNP transistor being connected to the other side of said resistor for charge and a collector of said PNP transistor being connected through a resistor to the negative terminal of said DC power source.

* * * * *